(12) United States Patent
Gardner

(10) Patent No.: US 6,566,755 B1
(45) Date of Patent: *May 20, 2003

(54) METHOD OF FORMING A HIGH SURFACE AREA INTERCONNECTION STRUCTURE

(75) Inventor: Donald S. Gardner, Mountain View, CA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/978,746

(22) Filed: Nov. 26, 1997

Related U.S. Application Data (60) Division of application No. 08/396,131, filed on Feb. 28, 1995, now Pat. No. 5,817,574, which is a continuation-in-part of application No. 08/175,053, filed on Dec. 29, 1993, now Pat. No. 5,444,022.

(51) Int. Cl.$^7$ .......................... H01L 23/48; H01L 23/52; H01L 29/40
(52) U.S. Cl. .................. 257/758; 257/762; 257/763; 257/768; 257/774
(58) Field of Search .................. 257/758, 768, 257/774, 762, 763, 751; 438/622, 625, 637, 648, 650

(56) References Cited

U.S. PATENT DOCUMENTS

| | | | |
|---|---|---|---|
| 4,507,852 A | 4/1985 | Karulkar | 437/195 |
| 4,673,623 A * | 6/1987 | Gardner et al. | 257/763 |
| 4,714,686 A | 12/1987 | Sander et al. | 437/195 |
| 4,879,257 A | 11/1989 | Patrick | 437/195 |
| 4,917,759 A * | 4/1990 | Fisher et al. | 438/625 |
| 4,943,539 A * | 7/1990 | Wilson et al. | 438/637 |
| 5,106,461 A | 4/1992 | Volfson et al. | 437/195 |
| 5,202,579 A * | 4/1993 | Fujii et al. | 257/751 |
| 5,219,793 A | 6/1993 | Copper et al. | 437/195 |
| 5,345,108 A * | 9/1994 | Kikkawa | 257/751 |
| 5,444,022 A | 8/1995 | Gardner | 437/195 |
| 5,627,345 A * | 5/1997 | Yamamoto et al. | 174/265 |

FOREIGN PATENT DOCUMENTS

JP  1-308051  * 12/1989  ................ 257/758

* cited by examiner

Primary Examiner—Steven Loke
Assistant Examiner—Thien F Tran
(74) Attorney, Agent, or Firm—Blakley, Sokoloff, Taylor & Zafman LLP (57) ABSTRACT

A novel, high performance, high reliability interconnection structure for an integrated circuit. The interconnection structure of the present invention is formed on a first insulating layer which in turn is formed on a silicon substrate or well. A first multilayer interconnection comprising a first aluminum layer, a first refractory metal layer, and a second aluminum layer is formed on the first insulating layer. A second insulating layer is formed over the first multilayer interconnection. A conductive via is formed through the second insulating layer and recessed into the first multilayer interconnection wherein a portion of the via extends above the second insulating layer. A second interconnection is formed on the second insulating layer and on and around the portion of the via extending above the second insulating layer.

14 Claims, 8 Drawing Sheets

METHOD OF FORMING A HIGH SURFACE AREA INTERCONNECTION STRUCTURE

CROSS REFERENCE TO RELATED PATENT APPLICATION

This is a divisional of application Ser. No. 08/396,131, filed Feb. 28, 1995, now U.S. Pat. No. 5,817,574, which is a continuation-in-part of application Ser. No. 08/175,053 filed Dec. 29, 1993 Issued U.S. Pat. No. 5,444,022.

BACKGROUND OF THE INVENTION

1. Field of the invention

The present invention relates to the field of multilevel integrated circuits, and more specifically, to the field of ULSI multilevel interconnection structures and their methods of fabrication.

2. Discussion Of Related Art

Modern integrated circuits are made up of literally millions of active devices such as transistors and capacitors. These devices are initially isolated from one another but are later interconnected together to formed functional circuits. The quality of the interconnection structure drastically affects the performance and reliability of the fabricated circuit. Interconnections are increasingly determining the limits of performance and density of modern ultra large scale integrated (ULSI) circuits.

Figure 1:
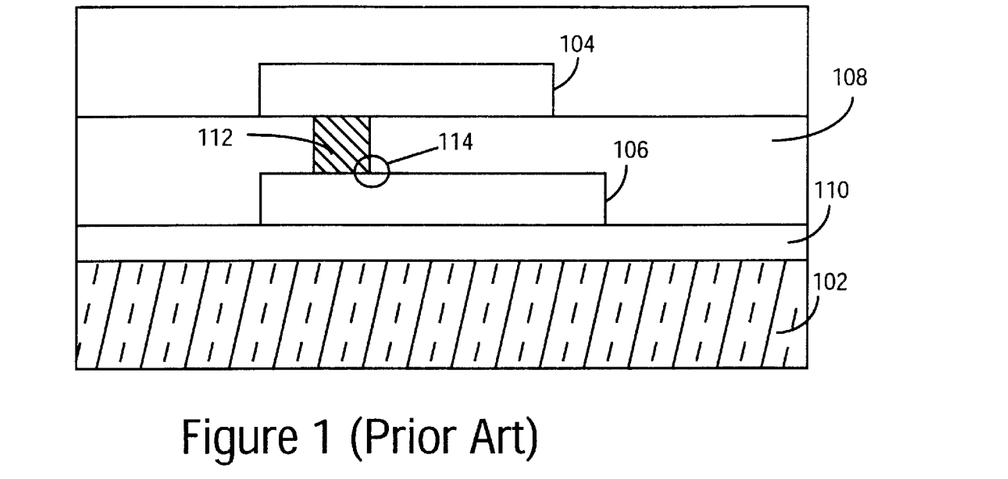
FIG. 1 is an illustration of a cross-sectional view of a prior art interconnection structure.

FIG. 1 is a cross-sectional illustration of an interconnection structure which is presently used in the semiconductor industry. Formed in a silicon substrate or well 102 are active devices (not shown) such as transistors and capacitors. Interconnection lines 104 and 106, which are typically aluminum or aluminum alloys, are used to couple active devices into functional circuits. Metal interconnections 104 and 106 and substrate 102 are electrically isolated from one another by interlevel dielectric's (ILDs) 108 and 110, respectively. Electrical connections are made between metal interconnections 104 and 106 through the use of metal vias 112.

The interconnection structure of FIG. 1 experiences several problems. As integrated circuit dimensions decrease, in order to increase circuit density and complexity, vias are becoming smaller by the square of the dimension decrease. Such small vias can cause both reliability and performance problems in a fabricated integrated circuit. Reliability problems are caused by high concentrations of current or current crowding at the corners 114 of via 112, as shown in FIG. 1. Current crowding in area 114 can cause self-heating effects which can cause electromigration. Electromigration can cause voids and open circuits and other reliability problems. Performance of small dimensioned vias is decreased due to an increase in contact resistance caused by a reduction of the interfacial contact area between via and interconnections. It is to be appreciated that contact resistance is becoming the major portion of the total interconnection resistance.

Another problem with the interconnection structure of FIG. 1 is the aluminum metal used for interconnections 104 and 106. Aluminum interconnections are known to suffer from electromigration. Electromigration in interconnections are known to cause voids which can cause open circuits and failures. Aluminum interconnections are also known to form hillocks which can result in nonplanar interconnection structures and can cause interlevel shorts with interconnections formed above and intralevel shorts with neighboring interconnection lines from the same level of metalization. These problems are magnified as line widths decrease and packing densities increase as in the case of future ULSI circuits.

Thus, what is desired is a ULSI compatible interconnection structure which exhibits excellent performance and reliability.

SUMMARY OF THE INVENTION

A novel, high performance, high reliability, high density, ULSI manufacturable, multilevel interconnection structure is described. The interconnection structure of the present invention is formed on a first insulating layer of an integrated circuit. A first multilayer interconnection comprising a first aluminum layer, a first refractory metal layer, and a second aluminum layer is formed on the first insulating layer. A second insulating layer is formed over the first multilayer interconnection. A conductive via of, for example, tungsten, aluminum, copper or TiN, is formed through the second insulating layer and into the multilayer interconnection wherein the via is formed down to at least the first refractory metal layer of the multilayer interconnection to form a high surface area contact with the first multilayer interconnection. A portion of the conductive via extends above the second insulating layer so that a high surface area contact can be made to a second interconnection which is formed on the second insulating layer and on and around the portion of the via extending above the second insulating layer.

A goal of the present invention is to form an interconnection structure which exhibits excellent performance and reliability even when formed to the small dimensions necessary for modern ULSI circuits.

Another goal of the present invention is to provide an interconnection structure which provides decreased current crowding around vias.

Still another goal of the present invention is to provide an interconnection structure which exhibits redundant current carrying capabilities.

Still yet another goal of the present invention is to provide an interconnection structure which is resistant to electromigration and related failures.

Still other goals and advantages of the present invention will become obvious from the detailed description of the present invention which follows.

BRIEF DESCRIPTION OF THE DRAWINGS

FIG. 3b is an illustration of a cross-sectional view showing the formation of a multilayer interconnection, an insulating layer, and a third aluminum-alloy layer on the substrate of FIG. 3a.

FIG. 4a is an illustration of a cross-sectional view showing the formation of a multilayer interconnection, an insulating layer and a sacrificial layer on the substrate of FIG. 3a.

FIG. 4b is an illustration of a cross-sectional view showing the formation of a via hole in the substrate of FIG. 4a.

DETAILED DESCRIPTION OF THE PRESENT INVENTION

The present invention describes a novel, high density, high reliability, high performance interconnection structure with a ULSI manufacturable process. In the following description numerous specific details are set forth such as materials thicknesses and types in order to provide a thorough understanding of the present invention. It will be obvious, however, to one skilled in the art that the present invention may be practiced without these specific details. In other instances, well-known semiconductor manufacturing processes and equipment have not been set forth in detail in order to not unnecessarily obscure the present invention.

Figure 2:
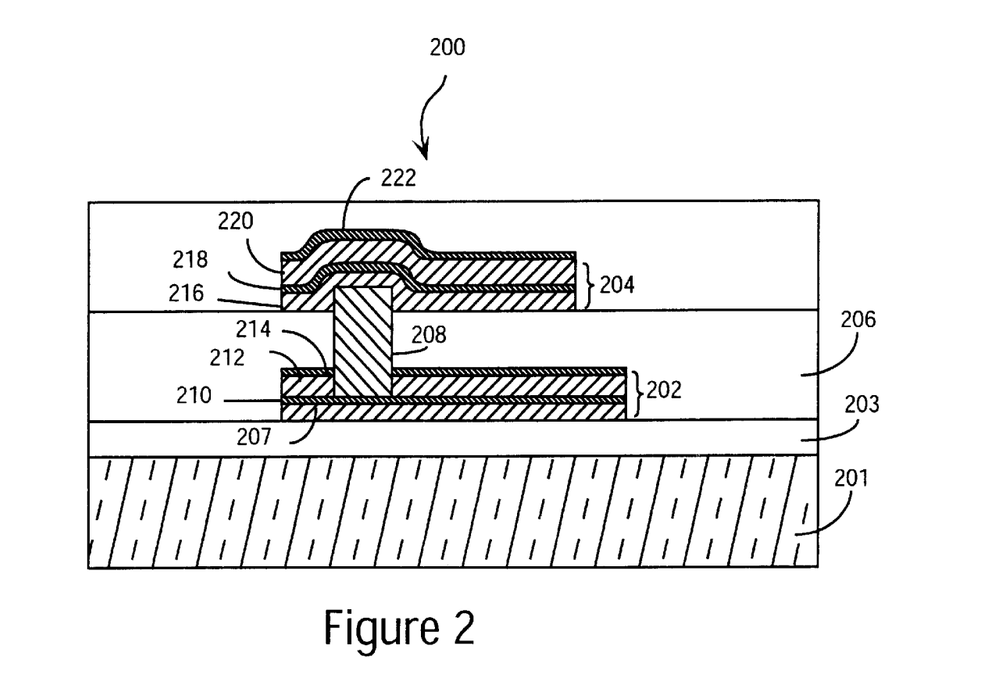
FIG. 2 is an illustration of a cross-sectional view of the novel interconnection structure of the present invention utilizing high surface area vias and electromigration resistant multilayer interconnections.

A preferred embodiment of the present invention is shown in FIG. 2. The present invention is a multilevel interconnection structure 200 which is ideal for high density, high reliability, and high performance integrated circuits. Interconnection structure 200 comprises interconnections 202 and 204. Interconnection structure 200 is formed on an interlayer dielectric 203 which in turn is formed on a silicon substrate or well 201. In the preferred embodiment interconnections 202 and 204 are multilayer interconnections. Multilayer interconnections 202 and 204 are electrically isolated from one another by an interlayer dielectric (ILD) 206 such as $SiO_2$. Multilayer interconnection 202 comprises a first aluminum-copper alloy layer 207, a first refractory metal layer 210, such as titanium, a second aluminum-copper alloy layer 212, and a second refractory metal layer 214. Multilayer interconnection 204 has a similar structure, comprising a third aluminum-copper alloy layer 216, a third refractory metal layer 218, a fourth aluminum-copper alloy layer 220, and a fourth refractory metal layer 222. High surface area via 208 couples multilayer interconnection 202 to multilayer interconnection 204. Via 208 is formed through ILD 206, and through second refractory metal layer 214 and second aluminum copper alloy layer 212 to first refractory metal layer 210 of multilayer interconnection 202. Additionally, in this embodiment of the present invention, a portion of via 208 extends above ILD 206 and interconnection 204 is formed over and around the portion of via 208 which extends above ILD 206. In this way via 208 has a high surface area contact to both interconnection 204 and 202.

An important feature of the present invention is the use of high surface area vias. In the preferred embodiment of the present invention high surface area contacts are made between via 208 and interconnections 202 and 204. By using a high surface area via, both the performance and reliability of the interconnection structure 200 are improved. For example, since via 208 is formed through metal layers 214 and 212, and is in contact with refractory metal layer 210, the interfacial contact area between via 208 and multilayer interconnection 202 is much larger than with traditional vias. That is, via 208 has a much larger area in contact with multilayer interconnection 202 than it would have if a traditional via were utilized. For example, when a circular via is utilized, the interfacial contact area is increased from:

$$a=\pi r^2$$

to:

$$a=\pi r^2+2\pi rd$$

where r is the radius of the via 208 and d is the depth at which via 208 is recessed into interconnection 202. The change in geometry results in both improved reliability and an increase in circuit performance (speed). The higher surface area contact decreases the resistance of the contact (which improves performance) because contact resistance itself is a substantial source of the total resistance of the interconnection. Reliability is improved in the present invention because the high surface area contacts result in less current crowding around the corners of via 208. Less current crowding decreases the peak current densities. A decrease in peak current density decreases the potential for electromigration in via 208 and therefore improves the reliability of interconnection structure 200. It is to be noted that via 208 in the preferred embodiment has vertical sidewalls allowing for high density packing of vias which will be required for future ultra large scale integrated (ULSI) circuits.

Although standard single layer interconnections can be used in the present invention, multilayer interconnections are preferred. Multilayer interconnections provide several advantages for interconnection structure 200. Multilayer interconnections 202 and 204 provide improved electromigration resistance because they comprise aluminum-refractory metal layer stacks. It is to be appreciated that refractory metals, such as titanium (Ti), tungsten (W), and molybdenum (Mo), and refractory metal compounds such as TiN are highly electromigration-resistant metals. Refractory metal layers 210 and 218 prevent voids from forming completely through multilayer interconnections 202 and 204. If a void forms in one aluminum layer it will not extend into the other aluminum layer because the refractory metal layer "sandwiched" between the two aluminum layers prevents its expansion. Refractory metal capping layers 214 and 222 deposited onto second aluminum alloy layers 212 and 220, respectively, help suppress hillock formation, which as mentioned earlier, can cause both intralevel and interlevel shorts. Hillocks can also cause non-planar interconnection levels which can cause downstream manufacturing problems.

Another advantage with the use of multilayer interconnections 202 and 204 in the present invention is that they provide redundant current paths. That is, if a void forms in one aluminum layer then current can bypass the void by flowing through other layers. It is to be appreciated, however, that if standard vias were utilized, this redundancy would be lost around the vias. The problem is that the metal layers are generally parallel to the surface of an integrated circuit, so that when a via is reached, current has to change direction and traverse perpendicular to the surface. Thus, if standard vias were utilized, all current from both aluminum layers of an interconnect would have to pass through the area directly beneath or above the via. Such a high current density in these areas can cause void formation. If a void formed either in the area directly above or below a standard via contact the device would fail because there is no alternative current path to the via. Thus by using high surface area via 208, redundancy is preserved in the present invention. In interconnection structure 200 all current does not flow through one area of the multilayer interconnections. In the preferred embodiment of the present invention both interconnections 202 and 204 provide multiple current paths to via 208 making the interconnection structure highly reliable.

Although aluminum alloy-refractory metal "sandwiches" are preferred in the present invention, other electromigration resistant structures may be utilized to form a high reliability interconnection structure. For example, a refractory metal or refractory metal compound, such as Ti or TiN, can be formed first (not shown) to help improve adhesion and help reduce electromigration. Additionally, metals such as tungsten (W), molybdenum (Mo), Copper (Cu), and Silver (Ag) and their alloys can be used as the main current carrying conductor in place of aluminum and its alloys. What is important is to provide an electromigration resistant material in the interconnection to help prevent electromigration and to preserve redundancy.

Although multilayer interconnections are preferred in the present invention, single layer interconnections can be used if desired. Copper or its alloys, for example, can be used to form high performance, highly reliable single layer interconnections. Copper has a very low resistivity and also is a very electromigration-resistant material. It is to be appreciated that a single layer interconnection is much easier to fabricate than a multilayer interconnection. A single layer interconnection decreases process complexity and fabrication cost.

It is to be noted that although tungsten is the preferred material for via filling in the present invention, other materials including but not limited to aluminum, aluminum alloys, copper, copper alloys, TiN or polysilicon can be utilized for via filling.

Figure 3A:
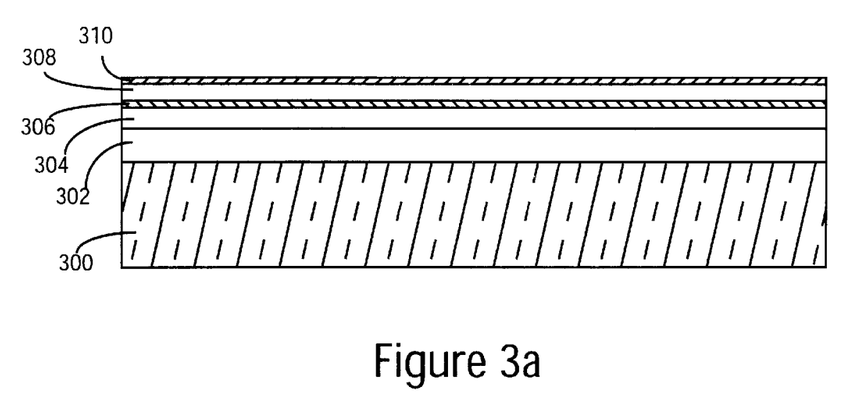
FIG. 3a is an illustration of a cross-sectional view of a silicon substrate having an insulating layer formed upon it, a first aluminum alloy layer formed upon the insulating layer, a first refractory metal layer formed upon the first aluminum alloy layer, a second aluminum alloy layer formed upon the first refractory metal layer, and a second refractory metal layer formed upon the second aluminum alloy layer.

In fabrication of a preferred embodiment of the interconnection structure of the present invention, an interlevel dielectric (ILD) 302, such as $SiO_2$, is formed on a silicon substrate or well 300, as shown in FIG. 3a. Active devices such as transistors and capacitors (not shown), have been previously formed in substrate 300. Next, a first aluminum or aluminum alloy layer 304, such as aluminum with 0.5% by weight of copper, is formed on ILD 302. The aluminum alloy layer 304 is formed to a thickness of between 2000–6000 Å. The first aluminum alloy layer 304 can be formed with well-known sputtering techniques. It is to be appreciated that other highly conductive materials including, but not limited to, copper (Cu), silver (Ag), gold, molybdenum (Mo), tungsten (W), and their alloys can be used. Next, a first refractory metal layer 306 is formed on the first aluminum alloy layer. In the preferred embodiment of the present invention the first refractory metal layer 306 is titanium formed to a thickness of between 100–500 Å with well-known sputtering techniques. It is to be appreciated that other refractory metals such as Tungsten (W) and Molybdenum (Mo), Tantalum (Ta), and Niobium (Nb), and refractory metal compounds such as Titanium-nitride (TiN) and Titanium-tungsten (TiW) may be used as refractory metal layer 306. Next, a second aluminum or aluminum alloy layer 308 is deposited on the first refractory metal layer 306. Second aluminum alloy layer 308 can be formed with well-known sputtering techniques to a thickness of between 2000–6000 Å. Next, a second refractory metal layer 310 is deposited onto the second aluminum alloy layer 308. The second refractory metal layer in the preferred embodiment is titanium. It is to be appreciated that deposition of layers 304, 306, 308 and 310 can be done in the same system without breaking vacuum. It is also to be appreciated that although only two aluminum-refractory metal "sandwiches" are used in the present invention, additional aluminum-refractory metal layers may also be used.

Figure 3B:
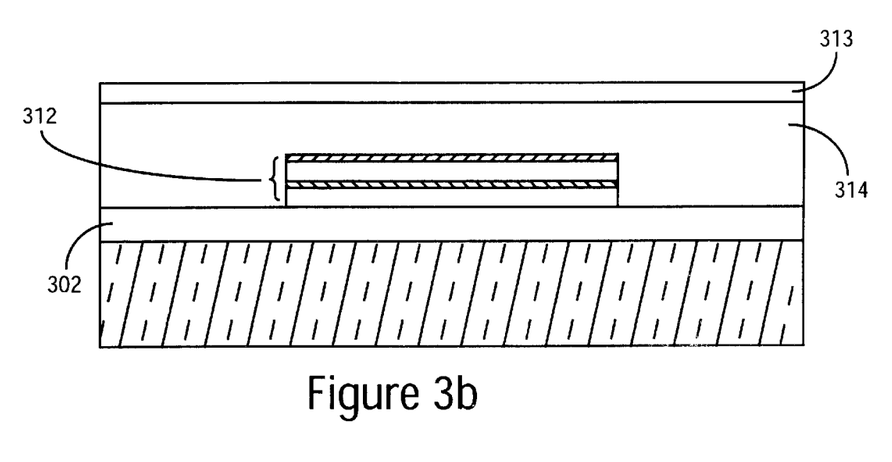

In reference to FIG. 3b, standard photolithography techniques are used to pattern layers 304, 306, 308, and 310 into multilayer interconnection 312. First a photoresist layer is formed over second refractory metal layer 310. The photoresist layer is then masked, exposed, and developed to define a location where the interconnection layer 312 is to be formed. Next layers 304, 306, 308 and 310 are anisotropically dry etched to form a multilayer interconnection 312. In the preferred embodiment layers 304, 306, 308, and 310 are plasma etched together at one time with a plasma chemistry comprising $BCl_3$, $Cl_2$ and $CHF_3$. Next, an ILD 314, for example $SiO_2$, is deposited onto ILD 302 and interconnection 312. ILD 314 electrically isolates interconnection 312 or metal 1 from a subsequently formed interconnection layer or metal 2. It is to be appreciated that ILD 314 can comprise multiple insulating layers or composite layers of $SiO_2$, spin on glass (SOG), and silicon nitride, etc. Planarization techniques, such as chemical-mechanical are preferably used at this time to planarize the surface of ILD 314.

Next, as shown in FIG. 3b, a low resistivity conductive layer 313, such as an aluminum-copper alloy layer, is formed. An aluminum alloy-layer 313 is deposited by any one of variety of well-known methods to a thickness which is equal to the distance at which a subsequent via is to extend into the interconnection of which aluminum-alloy layer 313 will form part.

Figure 3C:
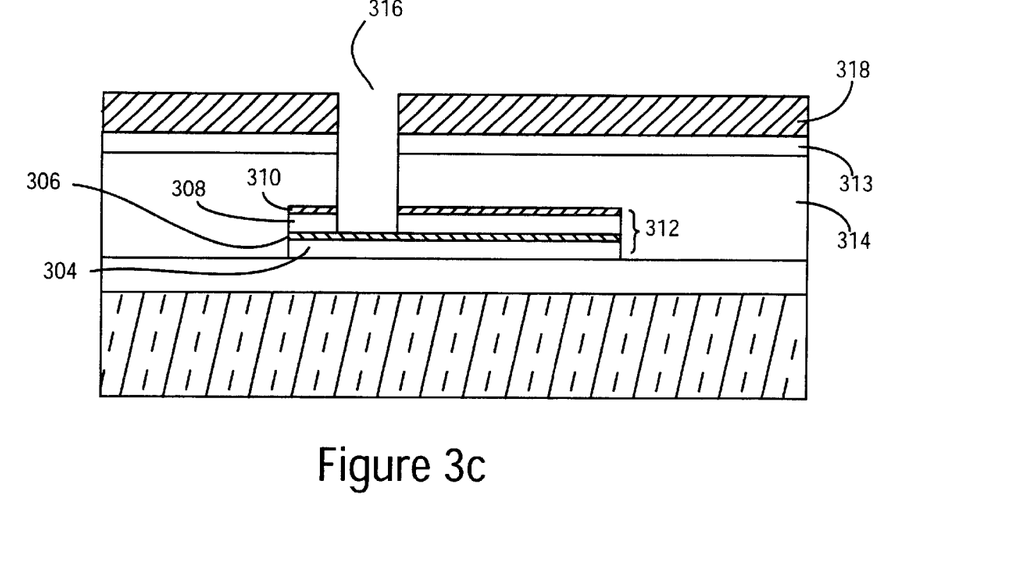
FIG. 3c is an illustration of a cross-sectional view showing the formation of a via hole in the substrate of FIG. 3b.

Next, via hole 316 is etched through aluminum-alloy layer 313 and ILD 314, second refractory metal layer 310, and second aluminum alloy layer 308 so that electrical connection can be made between multilayer interconnection 312 and a subsequently formed interconnection layer. As shown in FIG. 3c, a photoresist layer 318 is masked, exposed, and developed to define the location where the via hole 316 is to be formed. A dry anisotropic etch process is preferably used to form via hole 316 in the present invention. A dry anisotropic etch can form small dimensioned vias with vertical side walls which are compatible with high packing densities necessary for modern ULSI circuits.

First, a reactive ion etch (RIE) can be used to etch through conductive layer 313. If conductive layer 313 is an aluminum-alloy layer, a reactive ion etch with a chemistry comprising BCl$_3$, Cl$_2$ and CHF$_3$ can be utilized. A reactive ion etch with a chemistry comprising CHF$_3$ and O$_2$ can next be used to anisotropically etch via hole 316 through ILD 314.

Once the second refractory metal layer 310 is reached, the etch is stopped and a new etch chemistry is then introduced to anisotropically etch refractory metal layer 310 and aluminum alloy layer 308. A reactive ion etch with a chemistry comprising BCl$_3$, Cl$_2$ and CHF$_3$ can be used. Alternatively, a single reactive etch can be used to etch through layers 313, 314, 310 and 308, if desired. In the preferred embodiment of the present invention via hole 316 is etched until the first refractory metal layer 306 is reached. First refractory metal layer 306 can (depending upon the actual etch chemistry utilized) act either as an etch-stop or provide end point detection by allowing the monitoring of the change in etch by-products. Having an etch stop or endpoint detection capabilities allows overetching to be used, which guarantees via hole uniformity across the wafer and from wafer to wafer. This feature makes the present process extremely manufacturable.

The depth at which via hole 316 is etched into multilayer interconnection 312 can be varied as desired. This allows control over the resistance of the via by controlling the interfacial surface area between multilayer interconnection 312 and the subsequently formed via. Via hole 316 is preferably formed through the second aluminum alloy layer to at least the first refractory metal layer 306 in order to preserve the redundancy of the interconnection structure. Via hole 316 can, if desired, be formed at varying depths into the first aluminum alloy layer 304. Etching to the first refractory metal layer 306 is preferred because the first refractory metal layer 306 provides either an etch stop or end point detection capabilities.

Figure 3D:
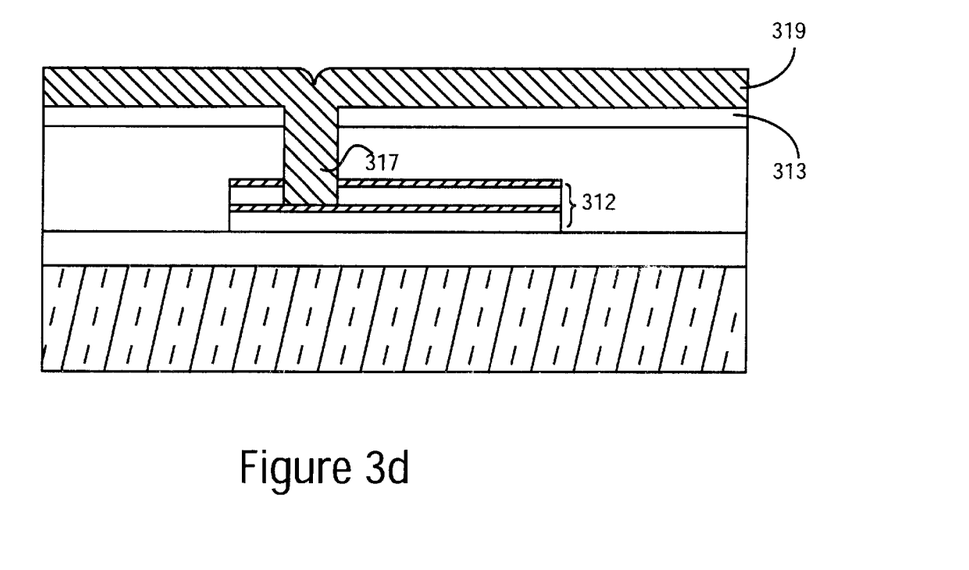
FIG. 3d is an illustration of a cross-sectional view showing the filling of the via hole with a conductive material on the substrate of FIG. 3c.

Once via 316 has been etched to the desired depth, photoresist layer 318 is removed with well-known techniques. Next, as shown in FIG. 3d, a conformal layer 319 of a conductive via filling material, such as tungsten, is blanket deposited over sacrificial layer 313 and into via hole 316. Via hole 316 is completely filled in the process to form a metalized via 317. Tungsten is preferred because it can be formed conformally with well-known chemical vapor deposition (CVD) techniques. Tungsten layer 319 is then etched back by means of a dry etch using a fluorine based chemistry. As an alternative, tungsten layer 319 can be etched back by means of well-known chemical-mechanical polishing techniques. The etch back process should employ a method which is more selective to via filling material 319 than to conductive layer 313, so that the etch back process is not dependent on a timed etch which can be manufacturably unacceptable. It is to be appreciated that via hole 316 can be filled with other conductive materials, such as aluminum, silver, polysilicon, copper or TiN, if desired.

Figure 3E:
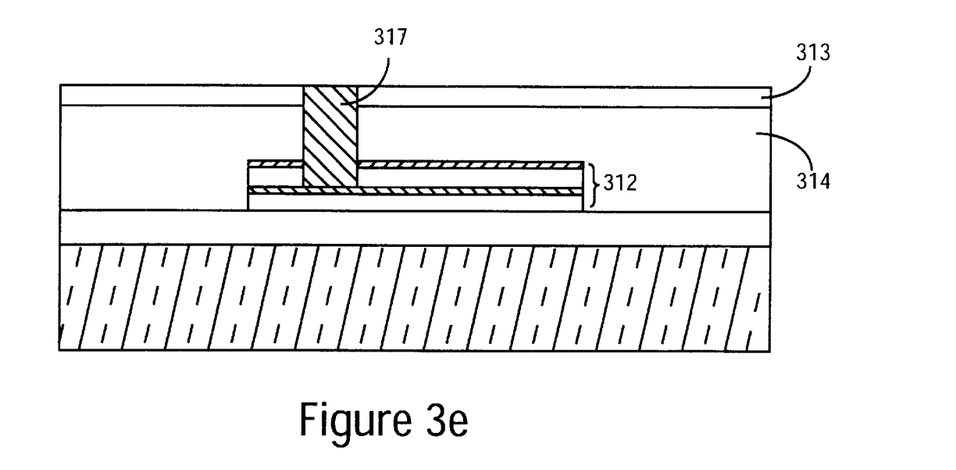
FIG. 3e is an illustration of a cross-sectional view showing the removal of the conductive material used to fill the via hole from the third aluminum-alloy layer of the substrate of FIG. 3d.

The result, as shown in FIG. 3e, is a high surface area tungsten plug or via 317 which is recessed into multilayer interconnection layer 312 and which is substantially planar with the top surface of conductive layer 313. It is to be appreciated that a slight dimple may form on top of filled via 317. The distance at which metalized via 317 extends above ILD 314 and into a subsequently formed interconnection can be varied as desired by varying the thickness of conductive layer 313. In this way the contact area between via 317 and the subsequently formed second interconnection can be set as desired. This in turn allows the tailoring of the contact resistance between a second interconnection and via 317.

In an alternative embodiment of the present invention via fill material 319 is not etched back or is only partially etched back so that via fill material 319 remains over conductive layer 313 to form part of the subsequently formed second interconnection or metal 2. In this embodiment via fill material 319 is patterned along with the other metal layers to form the second level of interconnections.

Figure 3F:
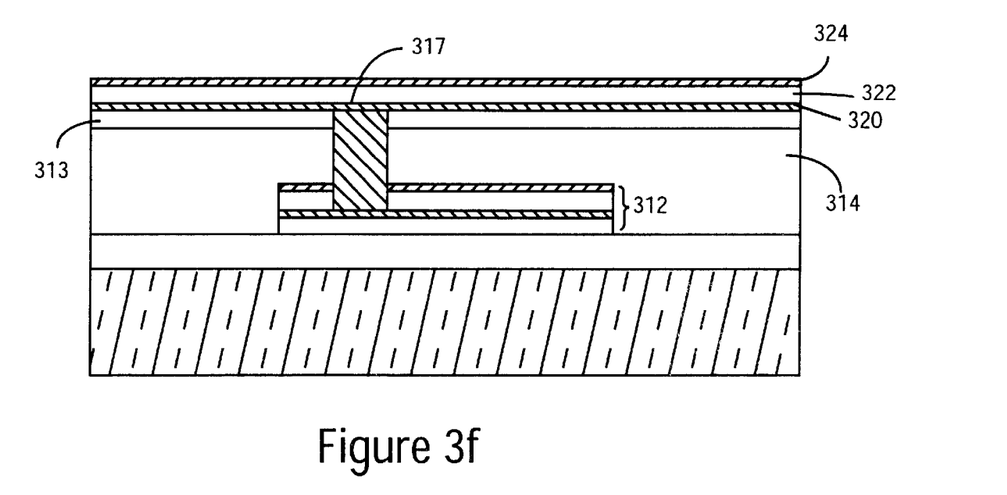
FIG. 3f is an illustration of a cross-sectional view showing the formation of a third refractory metal layer on the third aluminum-alloy layer on the substrate of FIG. 3e, the formation of a fourth aluminum-alloy layer on the third refractory metal layer and the formation of a fourth refractory metal layer on the fourth aluminum-alloy layer.
Figure 3G:
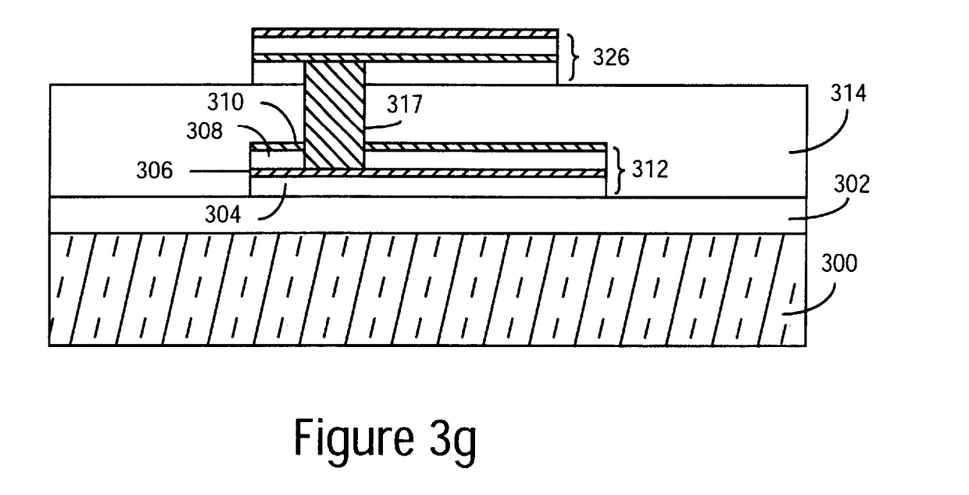
FIG. 3g is an illustration of a cross-sectional view showing the patterning of the third aluminum-alloy layer, the third refractory layer, the fourth aluminum-alloy layer, and the fourth refractory metal layer into an interconnection on the substrate of FIG. 3f.

Next, as shown in FIG. 3f, a third refractory metal layer 320, such as titanium, is formed over aluminum layer 313 and filled via 317. A fourth aluminum-alloy layer 322 and a fourth refractory metal layer 324 are formed respectively thereon. Next, as shown in FIG. 3g, metal layers 324, 322, 320, and 313 are patterned into an interconnection 326 as described above. As shown in FIG. 3g, interconnection 326 forms a high surface area contact with via 317 to provided improve reliability and performance over the prior art. Additionally, with the preferred technique, interconnection 326 is formed extremely planar, even with the high surface area contact, making it ideal for multilayer integrated circuits, especially lower levels of interconnection where planarization is most important.

Figure 4A:
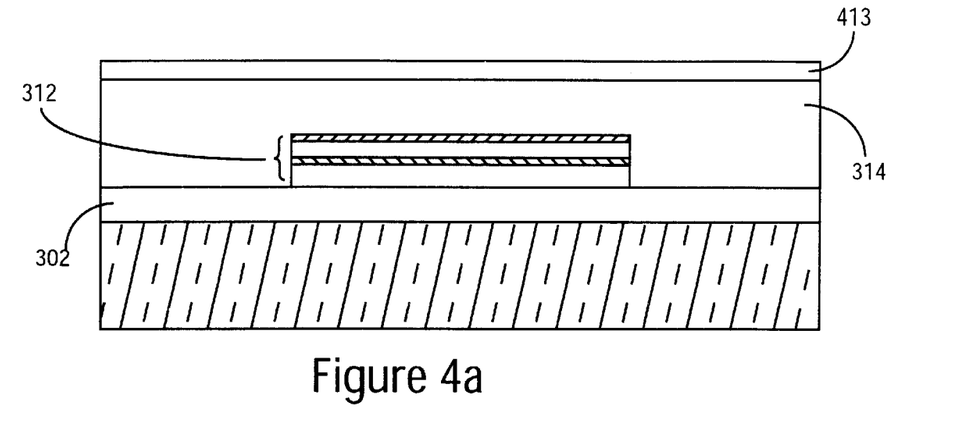

FIGS. 4a–4f detail an alternative embodiment of the high performance and high reliability interconnect structure and its method of fabrication. In this embodiment, as shown in FIG. 4a, after the patterning of interconnection 312 and the formation of ILD 314 as decribed above, a sacrificial layer 413 is formed over ILD 314. Sacrificial layer 413 is used to form a high surface area contact between a via and an interconnection formed above. Sacrificial layer 413 is formed to a thickness equal to the distance at which the via is to extend into the interconnection. The sacrificial layer 413 should be able to be selectively etched with respect to the material used to form ILD 314 and be selectively etched with respect to the metal to be used to form the via connection. A photoresist layer or a polyimide layer can be used as sacrificial layer 413. Such materials can be deposited with techniques well known in the art.

Figure 4B:
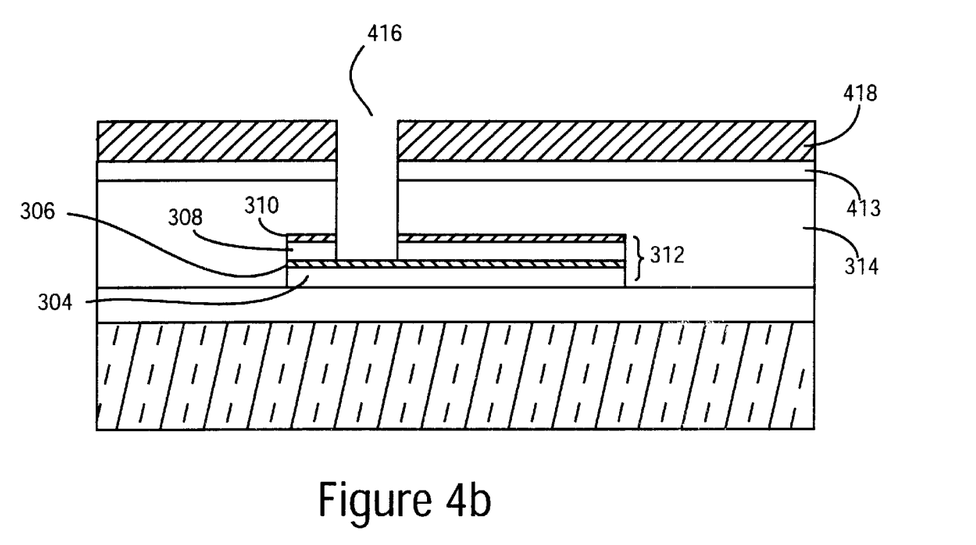

Next, via hole 416 is etched through sacrificial layer 413 and ILD 314, second refractory metal layer 310, and second aluminum alloy layer 308 so that electrical connection can be made between multilayer interconnection 312 and a subsequently formed metalization layer. As shown in FIG. 4b, a photoresist layer 418 is masked, exposed, and developed to define the location where the via hole 416 is to be formed. A dry anisotropic etch process is preferably used to form via hole 416 in the present invention. A dry anisotropic etch can form small dimensioned vias with vertical side walls which are compatible with high packing densities necessary for modern ULSI circuits. First a reactive ion etch with a chemistry comprising CHF$_3$ and O$_2$ is used to anisotropically etch via hole 416 through sacrificial layer 413 and ILD 314.

Once the second refractory metal layer 310 is reached, the first etch is stopped and a new etch chemistry is then introduced to anisotropically etch refractory metal layer 310 and aluminum alloy layer 308. A reactive ion etch with a chemistry comprising BCl$_3$, Cl$_2$ and CHF$_3$ can be used. Alternatively, the first reactive etch can be used to etch through layer 310 after etching via hole 416. The etch is continued until the first refractory metal layer 306 is reached. First refractory metal layer 306 can (depending upon the actual etch chemistry utilized) act either as an etch-stop for the etch or provide end point detection by allowing the monitoring of the change in etch by-products. Having an etch stop or endpoint detection capabilities allows overetching to be used, which guarantees via hole uniformity across the wafer and from wafer to wafer. This feature makes the present process extremely manufacturable.

The depth at which via hole 416 is etched into multilayer interconnection 312 can be varied as desired. This allows control over the resistance of the via by controlling the interfacial surface area between multilayer interconnection 312 and the subsequently formed via. Via hole 416 is preferably formed through the second aluminum alloy layer to at least the first refractory metal layer in order to preserve the redundancy of the interconnection structure. Via hole 416 can, if desired, be formed at varying depths into the first aluminum alloy layer 304. Etching to the first refractory metal layer 306 is preferred because the first refractory metal layer 306 provides either an etch stop or end point detection capabilities.

Figure 4C:
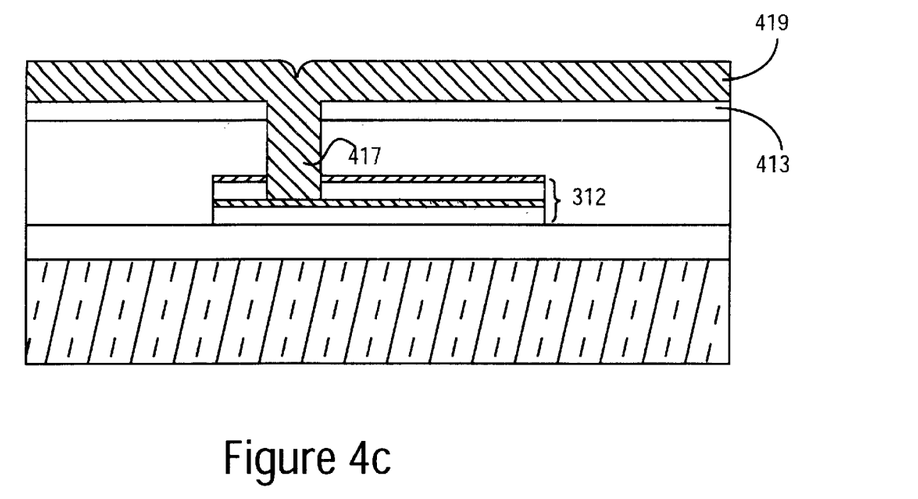
FIG. 4c is an illustration of a cross-sectional view showing the filling of the via hole with a conductive material on the substrate of FIG. 4b.

Once via 416 has been etched to the desired depth, photoresist layer 418 is removed with well-known techniques. Next, as shown in FIG. 4c, a conformal layer 419 of a via filling material, such as tungsten, is blanket deposited over sacrificial layer 413 and into via hole 416. Via hole 416 is completely filled in the process to form a metalized via 417. Tungsten is preferred as the via filling material because it can be formed conformally and can be formed with well-known chemical vapor deposition (CVD) techniques. Tungsten layer 419 is then etched back by means of a dry etch using fluorine based chemistry. As an alternative, tungsten layer 419 can be etched back by means of well-known chemical-mechanical polishing techniques. It is to be appreciated that via hole 416 can be filled with other conductive materials, such as aluminum, polysilicon, copper or TiN.

Figure 4D:
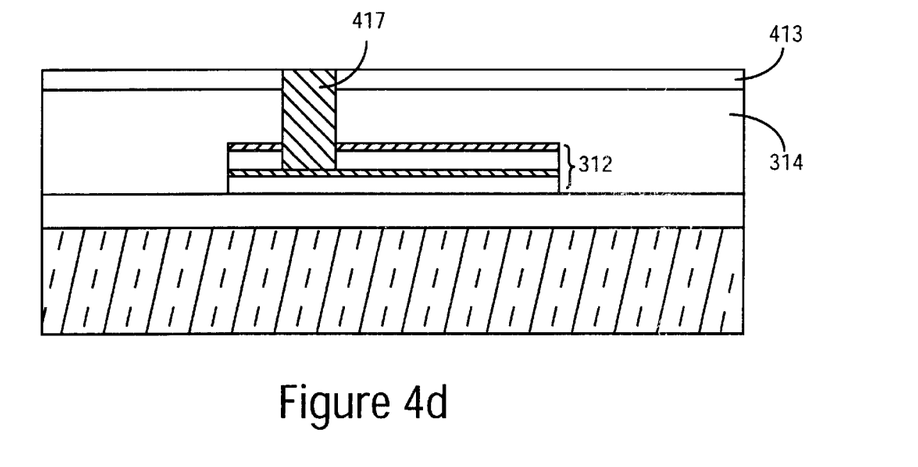
FIG. 4d is an illustration of a cross-sectional view showing the removal of the conductive material used to fill the via hole from the surface of the sacrificial layer on the substrate of FIG. 4c.
Figure 4E:
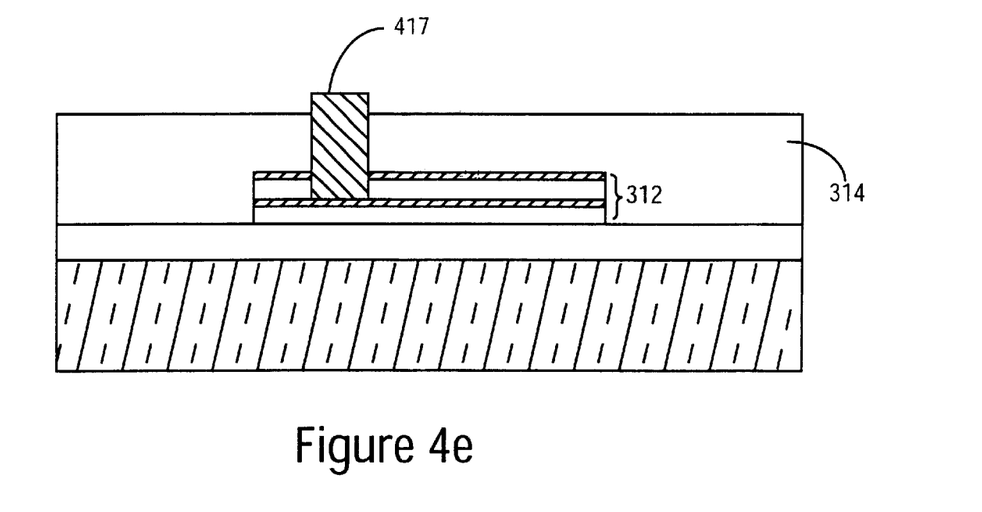
FIG. 4e is an illustration of a cross-sectional view showing the removal of the sacrificial layer from the substrate of FIG. 4d.

The result, as shown in FIG. 4d, is a high surface area tungsten plug or via 417 which is recessed into multilayer interconnection layer 312 and which is substantially planar with the top surface of sacrificial layer 413. It is to be appreciated that a slight dimple may form on top of filled via 417. Next, as shown in FIG. 4e, the sacrificial layer 413 is removed with techniques well known in the art. An etchant is chosen which can selectively etch sacrificial layer 413 without substantially etching either ILD 314 or via 417. As a result, metalized via 417 extends above ILD 314. The distance at which metalized via 417 extends above ILD 314 can be varied as desired by varying the thickness of sacrificial layer 413. In this way the contact area between via 417 and the subsequently formed second interconnection can be set as desired. This in turn allows the tailoring of the contact resistance.

Figure 4F:
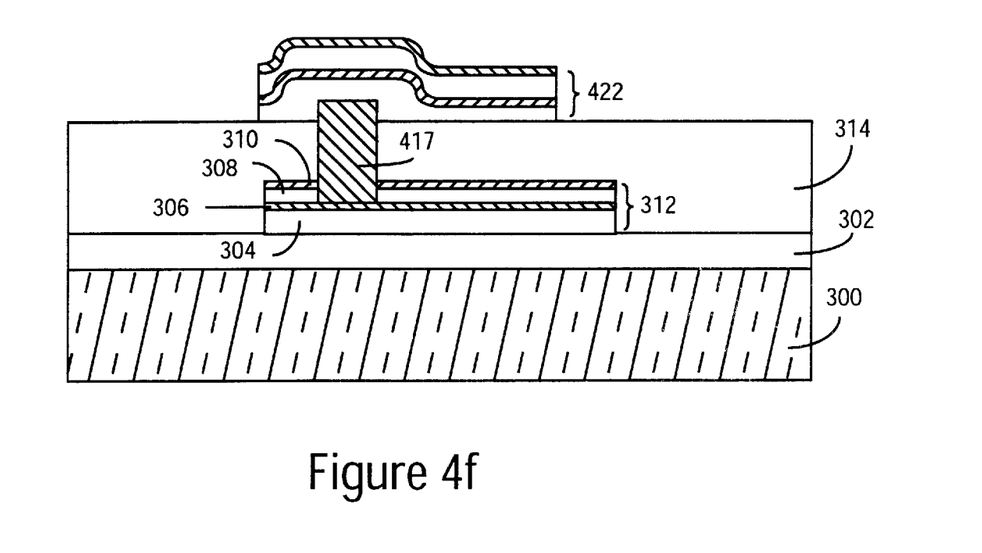
FIG. 4f is an illustration of a cross-sectional view showing the formation of a second multilayer interconnection on the second insulating layer and on and around the via of the substrate of FIG. 4e.

Next, as shown in FIG. 4f, a second level of metalization is formed. In this embodiment of the present invention, the second level of metalization provides a multilayer interconnection 422 having a structure similar to that of multilayer interconnection 312. Interconnection 422 is formed in manner similar to that of multilayer interconnection 312. Multilayer interconnection 422 is formed over and around the portion of conductive via 417 which extends above ILD 314, thereby forming a high surface area contact with interconnection 422. It is to be appreciated that the contact area between interconnection 422 and conductive via 417 is dependent upon the amount which via 417 extends above ILD 314. This amount is determined by the thickness of sacrificial layer 413. Multilayer interconnection layer 422 is now in electrical contact with multilayer interconnection 312.

Novel interconnections and their methods of fabrication have been described. It is to be appreciated that the described features of the present invention can be substituted, altered, or omitted without departing from the scope of the present invention For example, if desired, high surface area contacts may be made to only one interconnection and still obtain some reliability advantages. Additionally, different metals and/or stacking structures for the interconnections may also be used. It is also to be appreciated that the present invention is equally applicable to via connections made between higher levels of metalization (i.e., between metal 2 and metal 3, etc.) and is not to be limited to connections made between metal 1 and metal 2, as described Thus, novel, reliable, low resistivity, high performance, high density interconnection structures for a multilevel integrated circuit have been described.

I claim:

1. An interconnection structure for use in a multilevel integrated circuit comprising:
   a first interconnection formed on a first insulating layer wherein said first interconnection comprises:
      a first main current carrying conductive layer;
      a first refractory metal layer formed on said first main current carrying conductive layer; and
      a second main current carrying conductive layer formed on said first refractory metal layer;
   a second insulating layer formed on said first interconnection;
   a via connection formed through said second insulating layer and recessed into said second main current carrying conductive layer and to said first refractory metal layer so as to form a high surface area contact with said first interconnection wherein:the width of said via connection through said second insulating layer is the same as the width of said via connection in said second main current carrying conductive layer; and
   a second interconnection formed on said second insulating layer in contact with said via connection.

2. The interconnection structure of claim 1 wherein a portion of said via connection extends above said second insulating layer and wherein said second interconnection is formed on and around said portion of said via connection extended above said second insulating layer so as to form a high surface area contact between said via connection and said second interconnection.

3. The interconnection structure of claim 1 further comprising a second refractory metal layer is formed on said second main current carrying conductive layer.

4. The interconnection structure of claim 1 wherein said first refractory metal layer is selected from the group consisting of titanium, tungsten, tantalum, titanium nitride, and molybdenum.

5. The interconnection structure of claim 1 wherein said via connection is selected from the group consisting of aluminum, copper, and tungsten, and their alloys.

6. The interconnection structure of claim 1 wherein said first and second main current carrying conductive layers are formed from a material selected from the group consisting of aluminum, aluminum alloys, copper, copper alloys, silver and gold.

7. The interconnection structure of claim 1 wherein said second interconnection comprises:
   a third main current carrying conductive layer;
   a third refractory metal layer formed on said third conductive layer; and
   a fourth main current carrying conductive layer formed on said third refractory metal layer.

8. The interconnection structure of claim 7 wherein said third and fourth main current carrying conductive layers are formed from a material selected from the group consisting of aluminum, aluminum alloys, copper, copper alloys, silver and gold.

9. An interconnection structure for use in a multilevel integrated circuit comprising:

a first interconnection formed on a first insulating layer wherein said first interconnection comprises:
  a first main current carrying conductive layer comprising aluminum;
  a first refractory metal layer formed on said first main current carrying conductive layer; and
  a second main current carrying conductive layer comprising aluminum formed on said first refractory metal layer;
a second insulating layer formed on said first interconnection;
a via connection formed through said second insulating layer and recessed into said second main current carrying conductive layer and to said first refractory metal layer so as to form a first high surface area contact with said first interconnection wherein the width of said via connection through said second insulating layer is the same as the width of said via connection in said second main current carrying conductive layer, and wherein a portion of said via connection extends above said second insulating layer; and
a second interconnection formed on said second insulating layer and on and around said portion of said via connection extending above said second dielectric so as to form a high surface area contact between said second interconnection and said via connection and wherein said second interconnection has a planar top surface.

10. The interconnection structure of claim 9 wherein a second refractory metal layer is formed on said second conductive layer.

11. The interconnection structure of claim 9 wherein said via connection is formed through said second main current carrying conductive layer to said first refractory metal layer of said first interconnection.

12. The interconnection structure of claim 9 wherein said first refractory metal layer is selected from the group consisting of titanium, tungsten, tantalum, titanium nitride, and molybdenum.

13. The interconnection structure of claim 9 wherein said via is selected from the group consisting of aluminum, copper, TiN, silver, tungsten, and their alloys.

14. The interconnection structure of claim 9 wherein said second interconnection comprises:
  a third main current carrying conductive layer comprising aluminum;
  a third refractory metal layer formed on said third conductive layer; and
  a fourth main current carrying conductive layer comprising aluminum formed on said third refractory metal layer.

* * * * *

UNITED STATES PATENT AND TRADEMARK OFFICE
CERTIFICATE OF CORRECTION

PATENT NO. : 6,566,755 B1
DATED : May 20, 2003
INVENTOR(S) : Gardner

It is certified that error appears in the above-identified patent and that said Letters Patent is hereby corrected as shown below:

<u>Column 1,</u>
Line 18, delete "Modem", insert -- Modern --.

Signed and Sealed this

Thirtieth Day of September, 2003

JAMES E. ROGAN
*Director of the United States Patent and Trademark Office*